United States Patent
Cheng

(10) Patent No.: US 7,645,623 B2
(45) Date of Patent: Jan. 12, 2010

(54) LCD PIXEL ARRAY STRUCTURE AND FABRICATION METHOD THEREOF

(75) Inventor: Yi-Sheng Cheng, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 132 days.

(21) Appl. No.: 11/947,118

(22) Filed: Nov. 29, 2007

(65) Prior Publication Data

US 2008/0128719 A1 Jun. 5, 2008

(30) Foreign Application Priority Data

Dec. 1, 2006 (TW) ............... 95144783 A

(51) Int. Cl.
*H01L 21/00* (2006.01)
(52) U.S. Cl. .......... 438/30; 438/149; 257/E33.001
(58) Field of Classification Search ........... 438/30, 438/149; 257/E33.001
See application file for complete search history.

(56) References Cited

U.S. PATENT DOCUMENTS

| 5,734,449 | A | 3/1998 | Jang |
| 6,137,551 | A | 10/2000 | Jeong |
| 2002/0000553 | A1 | 1/2002 | Wong |
| 2005/0007535 | A1 | 1/2005 | Hirakata et al. |
| 2005/0190312 | A1 | 9/2005 | Yang |
| 2007/0072348 | A1* | 3/2007 | Chen ................... 438/149 |
| 2008/0020519 | A1* | 1/2008 | Cheng .................. 438/149 |

FOREIGN PATENT DOCUMENTS

TW I262344 9/2006

OTHER PUBLICATIONS

Chinese language Notice of Allowance dated Oct. 1, 2009 and its English language translation.
English language translation of abstract of TW I262344 (published Sep. 21, 2006).

* cited by examiner

*Primary Examiner*—Phat X Cao
(74) *Attorney, Agent, or Firm*—Thomas, Kayden, Horstemeyer & Risley

(57) ABSTRACT

Only five photomasks are used to fabricate a LCD pixel array structure. A gate dielectric layer of the LCD pixel array structure is formed by two deposition steps to increase the storage capacity of the storage capacitor.

6 Claims, 2 Drawing Sheets

LCD PIXEL ARRAY STRUCTURE AND FABRICATION METHOD THEREOF

RELATED APPLICATIONS

This application claims priority to Taiwan Application Serial Number 95144783, filed Dec. 1, 2006, which is herein incorporated by reference.

BACKGROUND

1. Field of Invention

The present invention relates to a liquid crystal display (LCD) and a fabrication method thereof. More particularly, the present invention relates to a LCD pixel array structure and a fabrication method thereof.

2. Description of Related Art

The ongoing of the optoelectronic technology in addition to the coming of the digital times propel the vigorous developing of the LCD market. Since LCDs have advantages of high display quality, small volume, light weight, low driving voltage, and low consuming power, LCDs are widely applied in consumable electronic products such as personal digital assistant (PDA), mobile phones, video recorders, notebook computers, displays of personal computers, displays used in cars, and projection televisions. Hence, LCDs have gradually replaced the cathode ray tube (CRT) displays and become the mainstream of displays in the market The fabrication method of the LCDs is mainly composed by deposition, photolithography, and etching processes. In these three processes, the cost of photolithography is the highest. Hence, how to reduce the number of photolithography processes, that is, how to reduce the number of photomasks, in the whole fabrication processes of a TFT array substrate is an important issue in LCD fabrication.

SUMMARY

According to an embodiment of this invention, a method of fabricating a LCD pixel array is provided.

First, a silicon island is formed on an active device area of a substrate. A first gate dielectric layer is formed on the silicon island and the substrate. At least a data line and at least a first electrode are formed on the first gate dielectric layer, wherein the data line is located on the external side of the active device area and the first electrode is located on a capacitor area of the substrate. A second gate dielectric layer is formed on the first gate dielectric layer, the data line and the first electrode. At least a gate and at least a second electrode are formed on the second gate dielectric layer, wherein the gate is located above the center of the silicon island and the second electrode is located on the first electrode. The silicon island is doped to form a source and a drain on two ends of the silicon island by using the gate as an implant mask.

A dielectric layer and a transparent layer are sequentially formed on the second gate dielectric layer, the gate, and the second electrode. The transparent conductive layer and the dielectric layer are patterned to form plural openings therein to respectively expose surfaces of the data line, the source, the drain, and the first electrode. A metal layer is formed in the openings and on the transparent conductive layer. The metal layer and the transparent conductive layer are patterned to respectively form at least a pixel electrode, a first conductive line between the source and the data line, and a second conductive line between the drain and the first electrode.

According to an embodiment of this invention, a pixel array structure of a liquid crystal display is provided.

At least a silicon island is on an active device area of a substrate, and two ends of the silicon island respectively has a doped area to be a source and a drain of a thin film transistor. A first gate dielectric layer is on the silicon island and the substrate. A data line is on an external side of the active device area. At least a first electrode is on a first gate dielectric with a capacitor area of the substrate underneath. A second gate dielectric layer is on the first gate dielectric layer, the data line and the first electrode. At least a gate is on the second gate dielectric layer with the central of the silicon island underneath. At least a second electrode is on the second gate dielectric layer with the first electrode underneath, wherein the first electrode, the second gate dielectric layer and the second electrode constitute a first storage capacitor. A dielectric layer is on the second dielectric layer, the gate and the second electrode, and a first, a second, a third, and a fourth openings in the dielectric layer respectively exposing the data line, the source, the drain, and the first electrode. A pixel electrode is on the first dielectric layer with a pixel area underneath, wherein the second electrode, the dielectric layer and the pixel electrode constitute a second storage capacitor. A first conductive line is on the dielectric layer and in the first opening and the second opening to connect the data line and the source. A second conductive line is on the dielectric layer and the in the third opening and the fourth opening to connect the drain and the first electrode.

According to an embodiment of this invention, a liquid crystal display using the pixel array structure described above is also provided. For example, the pixel array structure described above is disposed on a first substrate. A color filter array structure is disposed on a second substrate. Then, a liquid crystal layer is sandwiched between the first and the second substrate to constitute the liquid crystal display.

It is to be understood that both the foregoing general description and the following detailed description are made by use of examples and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
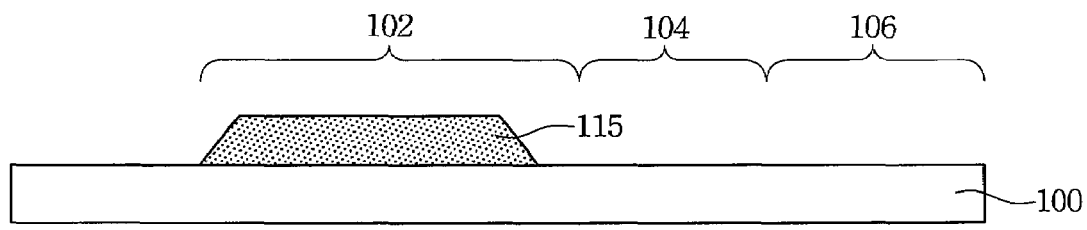
FIGS. 1-5 are cross-sectional diagrams showing various steps of fabricating a pixel array structure according to an embodiment of this invention.

FIGS. 1-5 are cross-sectional diagrams showing various steps of fabricating a pixel array structure according to an embodiment of this invention In FIG. 1, a semiconductor layer, such as a polysilicon layer or an amorphous layer, is formed on a substrate 100 having an active device area 102, a capacitor area 104, and a pixel area 106. The semiconductor layer, i.e. the polysilicon layer, is then patterned to form a patterned semiconductor layer, such as a silicon island 115, on the active device area 102. The forming method and the patterning method of the polysilicon layer are, for example, chemical vapor deposition and photolithography/etching, respectively.

Figure 2:
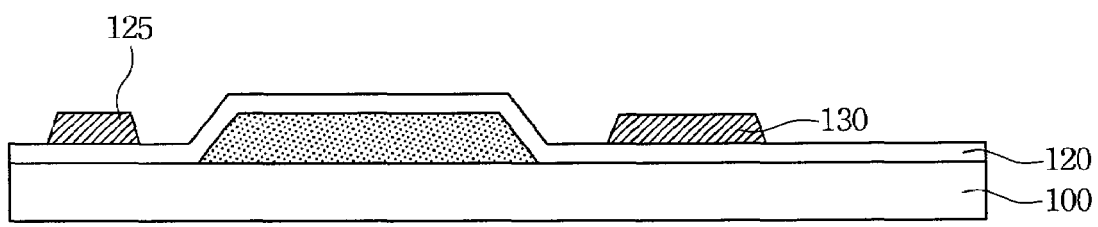

In FIG. 2, a first gate dielectric layer 120 and a first metal layer are sequentially formed on the substrate 100 and the silicon island 115. The first metal layer is then patterned to form a data line 125 on the external side of the active device area 102 and a first electrode 130, respectively.

The material of the first gate dielectric layer 120 is, for example, silicon oxide, silicon nitride, or silicon oxynitride. The forming method of the first gate dielectric layer 120 is, for example, chemical vapor deposition. The material of the first metal layer is, for example, aluminum-copper alloy, copper, or other proper conductive materials. The forming method of the first metal layer can be physical or chemical vapor deposition, and the patterning method of the first metal layer can be photolithography and etching.

Figure 3:
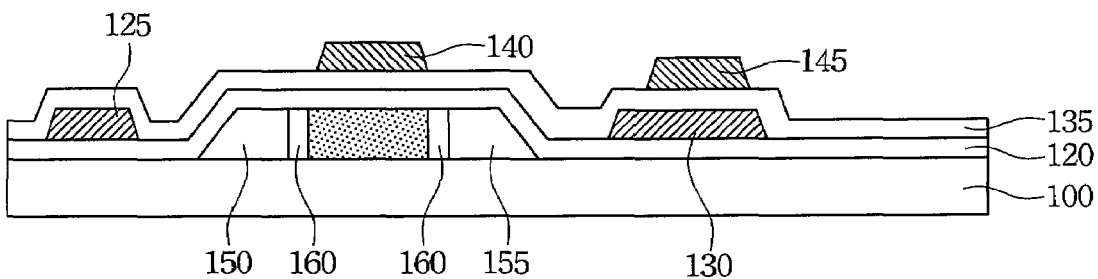

In FIG. 3, a second gate dielectric layer 135 and a second metal layer are sequentially formed on the first dielectric layer 120, the data line 125 and the first electrode 130. The second metal layer is then patterned to form a gate 140 above the silicon island 115 and a second electrode 145 above the first electrode 130. Next, dopants are implanted into the silicon island 115 by using the gate 140 as an implantation mask.

The overlapped parts of the first electrode 130, the second gate dielectric layer 135 and the second electrode 145 constitute a first storage capacitor. The first storage capacitor can therefore be formed simultaneously without any additional photomask during the formation of the data line 125 and the first electrode 130.

An additional wet etching process can be further performed to etch gate 140 for reducing the size of the gate 40. Then, an ion implantation process is performed to form lightly doped drain 160 on the internal sides of the source 150 and the drain 155 by using the reduced gate 140 as the implantation mask to improve the operation properties of the transistor composed of the gate 140, the source 150, and the drain 155.

The material of the second gate dielectric layer 135 can be, for example, silicon oxide, silicon nitride, or silicon oxynitride. The forming method of the second gate dielectric layer 135 can be, for example, chemical vapor deposition. The material of the second metal layer can be, for example, aluminum-copper alloy, copper, or other proper conductive layers. The forming method of the second metal layer can be physical or chemical vapor deposition, and the patterning method of the second metal layer can be photolithography and etching.

Figure 4:
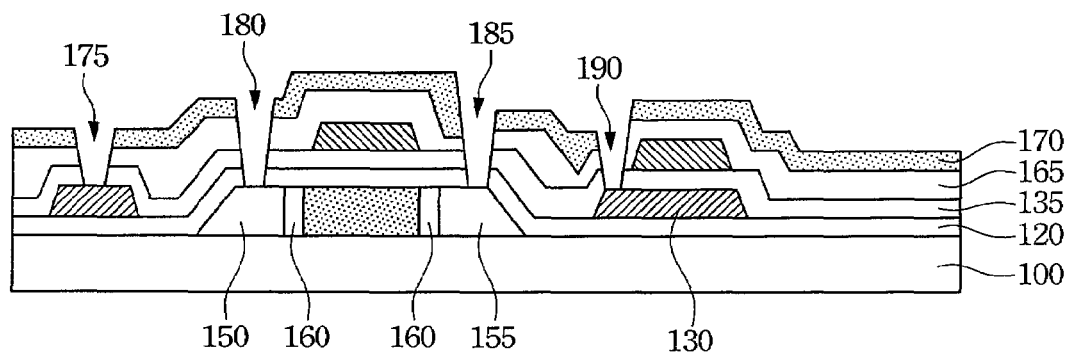

In FIG. 4, a dielectric layer 165 and a transparent conductive layer 170 are sequentially formed on the second gate dialectic layer 135, the gate 140 and the second electrode 145. The dielectric layer 165 and the transparent conductive layer 170 are then patterned to form openings 175, 180, 185, and 190 to respectively expose the data line 125, the source 150, the drain 155, and the first electrode 130.

The material and the forming method of the dielectric layer 165 can be, for example, silicon oxide and chemical vapor deposition, respectively. The material of the transparent conductive layer 170 can be, for example, indium tin oxide, aluminum zinc oxide, or indium zinc oxide. The forming method of the transparent conductive layer 170 can be, for example, chemical or physical vapor deposition. The patterning method of the dielectric layer 165 and the transparent conductive layer 170 can be, for example, photolithography and etching.

Figure 5:
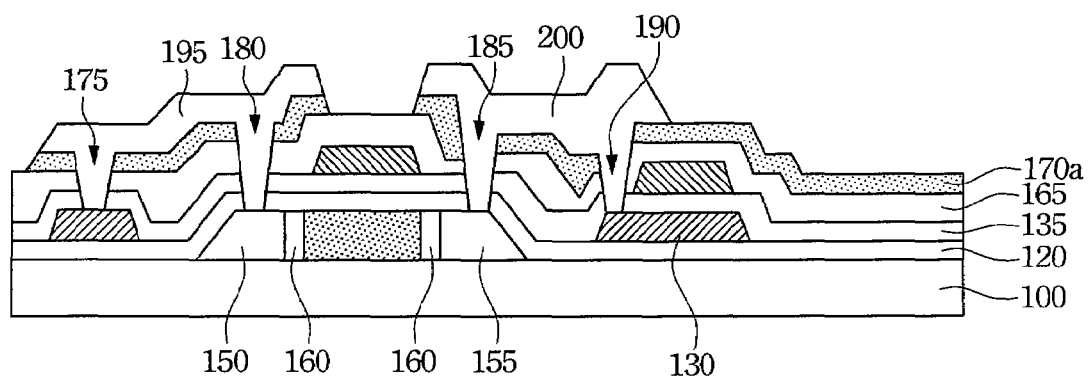

In FIG. 5, a third metal layer is formed on the transparent conductive layer 170 and in the openings 145, 180, 185, and 190. The third metal layer and the transparent conductive layer 170 are then patterned to form a pixel electrode 170a on the pixel area 105, a first conductive line 195 between the source 150 and the data line 125, and the second conductive line 200 between the drain 155 and the first electrode 130. The overlapped parts of the second electrode 145, the dielectric layer 165, and the pixel electrode 170a constitute a second storage capacitor.

The material of the third metal layer can be, for example, aluminum-copper alloy, copper, or other proper conductive material. The forming method of the third metal layer can be physical or chemical vapor deposition. The patterning method of the third metal layer and the transparent conductive layer 170 can be photolithography and etching. There are two types of removed depths in the step of patterning the third metal layer and the transparent conductive layer 170. One type of removed depth is to remove only the third metal layer on the exposed area of the pixel electrode 170a, the other type of removed depth is to remove both the third metal layer and the transparent conductive layer 170 outside the exposed pixel electrode 170a. Hence, the photomask used in the photolithography can be, for example, a half-tone photomask.

Figure 6:
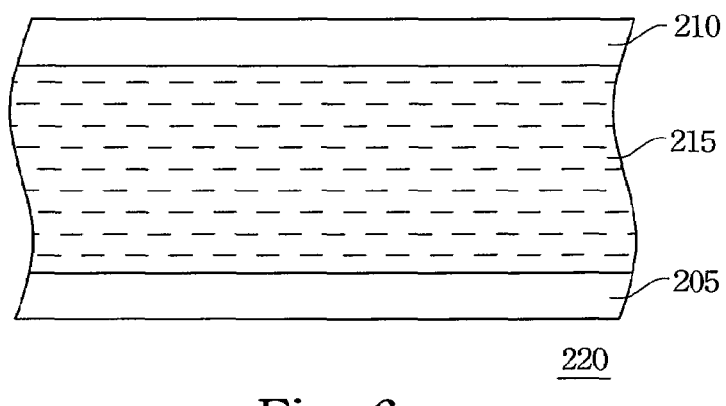
FIG. 6 is a cross-sectional diagram showing a general liquid crystal display.

The pixel array structure can be applied on any suitable flat panel display, such as liquid crystal display. FIG. 6 is a cross-sectional diagram showing a general liquid crystal display. In FIG. 6, liquid crystal display 200 has a first substrate 205, a second substrate 210, and a liquid crystal layer 215 therebetween. If the pixel array structure is disposed on the first substrate 205, the color filter array can be disposed on the second substrate 210. Since various modifications for liquid crystal display are well known by persons skilled in the art and are thus omitted here.

From the embodiments described above, only five photomasks are to needed to accomplish the pixel array structure. Moreover, the storage capacitor is made by series connecting the first and the second storage capacitor from FIG. 5. Further, only the first gate dielectric layer is the dielectric layer of the first storage capacitor, and the first electrode and the second electrode of the first storage capacitor are made by metal. These features can largely increase the storage capacitance of the storage capacitor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a LCD pixel array, comprising:
forming a patterned semiconductor layer on an active device area of a substrate;
forming a first gate dielectric layer on the patterned semiconductor layer and the substrate;
forming at least a data line and at least a first electrode on the first gate dielectric layer, wherein the data line is located on the external side of the active device area and the first electrode is located on a capacitor area of the substrate;
forming a second gate dielectric layer on the first gate dielectric layer, the data line and the first electrode;
forming at least a gate and at least a second electrode on the second gate dielectric layer, wherein the gate is located above the center of the patterned semiconductor layer and the second electrode is located above the first electrode;
doping the patterned semiconductor layer to form a source and a drain on two ends of the patterned semiconductor layer by using the gate as an implantation mask;
forming a dielectric layer on the second gate dielectric layer, the gate, and the second electrode;
forming a transparent conductive layer on the dielectric layer;
patterning the transparent conductive layer and the dielectric layer to form plural openings therein to respectively expose the data line, the source, the drain, and the first electrode;
forming a metal layer in the openings and on the transparent conductive layer; and
patterning the metal layer and the transparent conductive layer to respectively form at least a pixel electrode on a pixel area of the substrate, a first conductive line between the source and the data line, and a second conductive line between the drain and the first electrode.

2. The method of claim 1, wherein a material of the patterned semiconductor layer is polysilicon or amorphous silicon.

3. The method of claim 1, wherein a material of the first gate dielectric layer is silicon oxide, silicon nitride, or silicon oxynitride.

4. The method of claim 1, wherein a material of the second gate dielectric layer is silicon oxide, silicon nitride, or silicon oxynitride.

5. The method of claim 1, wherein a material of the dielectric layer comprises silicon oxide.

6. The method of claim 1, wherein a material of the transparent conductive layer is indium tin oxide, indium zinc oxide, or aluminum zinc oxide.

* * * * *